United States Patent

Bernin

[15] 3,638,222

[45] Jan. 25, 1972

[54] FLUX GATE SWITCH

[72] Inventor: Victor M. Bernin, Mount Prospect, Ill.

[73] Assignee: Illinois Tool Works Inc., Chicago, Ill.

[22] Filed: Nov. 24, 1969

[21] Appl. No.: 879,219

[52] U.S. Cl. ..........340/365
[51] Int. Cl. ..........H03k 17/02
[58] Field of Search ..........340/365, 345, 147, 307; 179/84, 90 K; 335/84, 85

[56] References Cited

UNITED STATES PATENTS

| | | | |
|---|---|---|---|
| 2,814,031 | 11/1957 | Davis | 340/365 X |
| 2,997,703 | 8/1961 | Powell | 340/365 X |
| 3,035,253 | 5/1962 | Devol | 340/365 X |
| 3,119,996 | 1/1964 | Comstock | 340/365 X |
| 3,160,875 | 12/1964 | Bernard | 340/365 X |
| 3,403,386 | 9/1968 | Perkins et al. | 340/172.5 |
| 3,495,236 | 2/1970 | Mathamel | 340/347 |

*Primary Examiner*—Richard Murray
*Attorney*—Robert W. Beart, Michael Kovac, Barry L. Clark and Jack R. Halvorsen

[57] ABSTRACT

This disclosure describes a solid-state magnetic switch such as that used in keyboard devices. The switch includes a keystem of magnetic material, a magnetic core, and a permanent magnet adjacent the magnetic core. When the keystem is not depressed, the flux from the magnet saturates the core. When the keystem is depressed, it moves adjacent the permanent magnet and provides a flux path which switches the saturating flux from the core. The core may function as either a transformer or a variable inductor. A plurality of the switches may be incorporated in a keyboard with either a coded or noncoded output, the coding being accomplished by selective threading of the cores with one or more windings.

13 Claims, 12 Drawing Figures

INVENTOR.
Victor M. Bernin

INVENTOR
Victor M. Bernin

FLUX GATE SWITCH

DESCRIPTION OF THE PRIOR ART

Keyboards comprise a well known means for entering data into data processing devices. When used for this purpose, the keyboards must be compact, extremely reliable, and designed to have long life. To meet these criteria, solid-state switches employing magnetic cores have been developed for use in keyboards. One of these prior art switches comprises a magnetic core, a permanent magnet, and a shield of magnetic material which may be moved by depressing a key. A drive-winding and a sense-winding thread each core. When the key is not depressed, flux from the permanent magnet saturates the core so that it cannot act as a transformer. When the key is depressed, it moves the shield between the permanent magnet and the core thus blocking the saturating flux and allowing the core to desaturate. The core then acts as a transformer so that signals applied to the drive winding may induce output signals in the sense winding.

In this prior art switch, the permanent magnet must be spaced sufficiently far from the magnetic core to allow the shield to be moved between them. Thus, the strength of the magnet must be greater than would be required if it could be placed closer to the core. Furthermore, great care must be taken to insure that the shield does not touch either the core or the permanent magnet and thus reduce its shielding capability.

BRIEF DESCRIPTION OF THE INVENTION

An object of this invention is to provide a solid-state magnetic core switch which does not have the disadvantages of the prior art switch described above.

An object of this invention is to provide a solid-state magnetic core switch including a core that is normally saturated by flux from a permanent magnet, and a flux gate for diverting the saturating flux from said core, the flux gate being thicker than the distance between the core and magnet.

Another object of this invention is to provide a solid-state switch of the type employing a permanent magnet and a toroidal core, said switch requiring less precision in manufacturing than similar switches heretofore known.

Still another object of the invention is to provide a solid-state keyboard wherein a plurality of magnetic core switches share a single permanent magnet.

Yet another object of the invention is to provide a keyboard switch which may function as either a transformer or a variable inductor.

A further object of the invention is to provide a keyboard switch which may be employed in keyboards producing either coded or noncoded outputs.

The above-stated and other objects of the invention are accomplished by provision of a permanent magnet, a magnetic core positioned closely adjacent one pole of the magnet, and a key operated magnetic shunt. A drive winding threads the core. The permanent magnet saturates the core when the key is not depressed and the core provide a low AC impedance. When a key is depressed the magnetic shunt is moved nearer the magnet so that the saturating flux is diverted from the core to the shunt. The core desaturates and thus provides a high AC impedance.

In a second embodiment the core acts as a transformer and is provided with one or more sense windings. When a key is not depressed, the core is saturated and will not function as a transformer. When a key is depressed, the saturating flux is diverted from the core to the magnetic shunt. The core desaturates and functions as a transformer. Signals on the drive winding then induce output signals in the sense windings.

DESCRIPTION OF THE PREFERRED EMBODIMENTS

Figures 1, 2, 3:
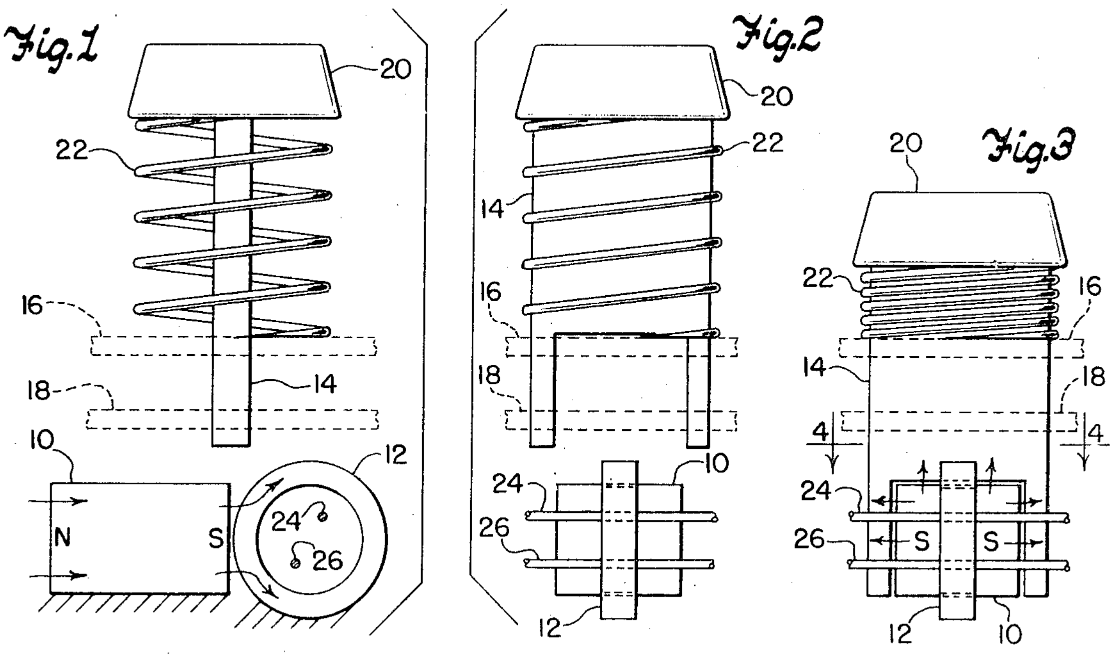
FIG. 1 is a schematic representation of a first embodiment of the invention.
FIG. 2 is a side view of FIG. 1 showing the key in the nondepressed state.
FIG. 3 is similar to FIG. 2 but shows the key in the depressed state.
Figure 4:
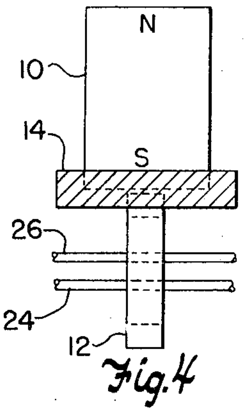
FIG. 4 is a top sectional view taken along the line 4—4 of FIG. 3.

FIGS. 1 and 2 are front and side views, respectively, of the invention showing a solid state magnetic core switch comprising a permanent magnet 10, a magnetic core 12, and a flux gate 14. The flux gate may also serve as a keystem in which case it is mounted for vertical movement in one or more keyboard support plates 16 and 18 and has a key cap 20 attached to its upper end. The flux gate and key cap comprise a key that is biased upwardly by a key return spring 22.

One pole of magnet 10 is positioned closely adjacent to core 12. The core and magnet are mounted on a suitable supporting base so as to touch or maintain a very small but fixed distance between the core and magnet. The permanent magnet may be made of a barium-filled ferrite compound and the core may be made of a ferrite material exhibiting low magnetic remanence properties. For purposes of illustration, a toroidal core is shown but it should be understood that cores of other shapes, preferably closed path may be used.

In the embodiment shown in FIGS. 1–4, the flux gate 14 is made of a material providing a low reluctance flux path and is recessed at its bottom in a shape generally conforming to the shape of magnet 10 at the end adjacent the core. This is best shown in FIGS. 2 and 3 which show the key in the nondepress and depressed conditions, respectively. As is evident from FIG. 1, the permanent magnet may be placed closer to the core than the width of the flux gate, thus enabling smaller magnets to be used. It is also evident that no critical tolerances must be maintained in order to prevent the flux gate from contacting the core.

The switch may function as a transformer switch or a variable inductor switch depending upon circuits connected to one or more windings 24 and 26 which may be threaded through the core.

When functioning as a variable inductor switch, a drive winding 24 is threaded through the core and connected to an AC signal source. Because of the high permeability of core 12 relative to air, flux from the pole of magnet 10 is concentrated in the core thus saturating it. The saturated core provides a low AC impedance as compared to its AC impedance when unsaturated. Therefore, as long as a key is not depressed, as illustrated in FIG. 2, the core acts as a low AC impedance in the drive winding 24.

When the key is depressed, as shown in FIG. 3, the flux gate 14 is moved adjacent the periphery of the permanent magnet and provides a low reluctance flux path which diverts at least a large part of the saturating flux away from the core. The core partially desaturates and acts as a high AC impedance in the drive winding 24. Upon release of the key the return spring moves the flux gate away from the permanent magnet so that the flux from the magnet again saturates the core.

When functioning as a transformer switch, the core 12 is threaded by a drive winding 24 that is connected to an AC signal source, and also threaded by one or more sense or output windings 26. As long as the key is not depressed, flux from magnet 10 saturates core 12 and the core cannot act as a transformer. When a key is depressed, the flux gate moves adjacent the magnet and shunts a major portion of the flux away from the core. The core desaturates and functions as a transformer so that the AC signal on the drive winding 24 induces an AC signal on each of the sense windings 26. When the key is released so as to move the flux gate away from the magnet, the flux from the magnet again concentrates in the core to saturate it.

The manner in which the keyboard switch may be incorporated in a complete keyboard circuit is subsequently described with reference to FIGS. 9 through 12.

Figure 5:
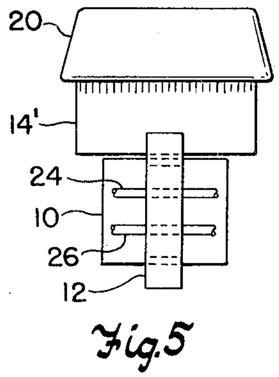
FIG. 5 shows a modified form of the flux gate.

Although it is preferable to have the flux gate conform to the shape of magnet 10, this particular configuration is not essential to correct operation of the switch. The bottom of the flux gate may be flat if the magnet 10 has a flat mating surface. This configuration is illustrated in FIG. 5 wherein the flux gate 14′ is shown in the key depressed position with its lower surface adjacent the upper surface of magnet 10.

The present invention is admirably suited for use in a keyboard arrangement wherein a single magnet is shared by a plurality of switches. FIG. 5 is a top sectional view showing a single elongated permanent magnet 10′ having a plurality of toroidal magnetic cores disposed closely adjacent thereto. A flux gate 14′ (shown in section) is associated with each core. The north pole of magnet 10′ extends along one of the longer sides of the magnet and the south pole is at the opposing side. This arrangement permits a maximum number of switches to share the same magnet while having the core of each switch immediately adjacent a pole of the magnet. Preferably, the downward travel of the flux gates is limited so that they may move closer to the magnet 10′ than the core 12 without touching the magnet.

Figure 6:
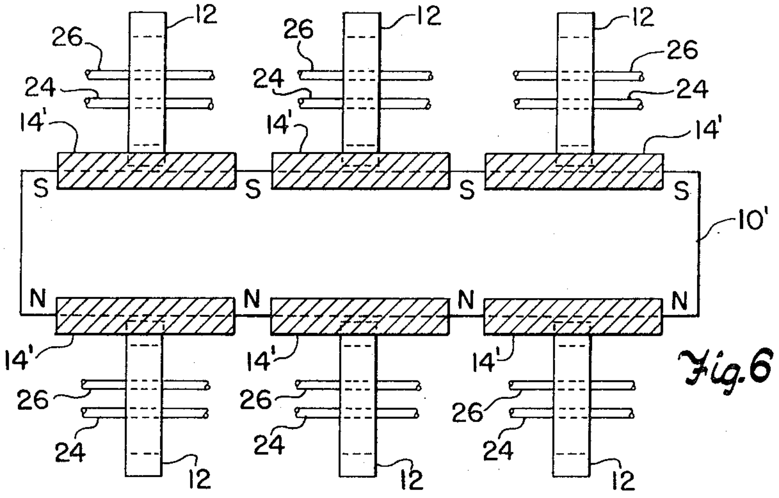
FIG. 6 shows a plurality of keyboard switches sharing a single magnet.

The switches of FIG. 6 function individually in exactly the same manner as the previously described embodiments.

Figure 7:
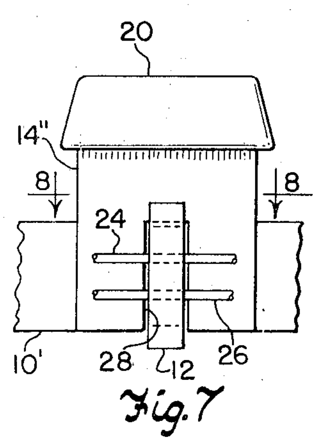
FIG. 7 shows a further modified form of the flux gate.
Figure 8:
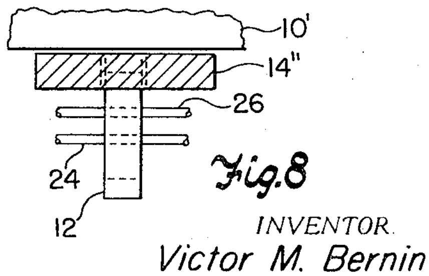
FIG. 8 is a top sectional view taken along the line 8—8 of FIG. 7.

FIGS. 7 and 8 illustrate a modification of FIG. 6 wherein it is not necessary to limit movement of the flux gates to prevent contact with the magnet. FIGS. 7 and 8 show only one switch in its depressed position but it will be understood that a plurality of switches may share the same permanent magnet 10′. The flux gate 14″ has a recess 28 cut in its lower edge. The recess is slightly wider than the width of core 12 and is cut deeply enough so that when the key is fully depressed the upper edge of the recess does not touch the core. As shown by the top sectional view of FIG. 8, the flux gate is positioned so that it moves in a plane immediately adjacent one side of permanent magnet 10′. The flux gate 14″ provides better diversion of saturating flux away from core 12 than does the flux gate 14′. Otherwise, the switch of FIG. 7 functions in the same manner as the switches previously described.

Figure 9:
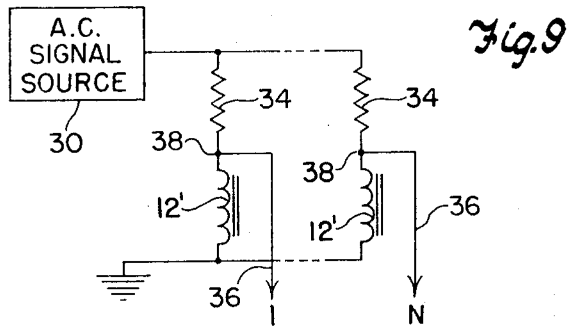
FIG. 9 is a circuit diagram illustrating how the switch may be employed as a variable inductor in a voltage divider arrangement.

FIG. 9 shows a keyboard circuit arrangement incorporating a plurality of keyboard switches connected to function as variable inductors. An AC signal source 30 is connected to ground or common circuit through a plurality of parallel circuits. There is one circuit for each switch and each circuit includes an impedance which may be a resistance 34 connected in series with a variable inductor 12′. It will be understood that each inductor 12′ of FIG. 9 corresponds to core 12 previously described with a single winding threading the core. The connection between resistor 34 and ground corresponds to the winding threading the core. An output lead 36 is connected to each series circuit at a point 38 between resistance 34 and inductor 12′.

The circuit of FIG. 9 operates as follows. When no keys are depressed, all cores 12 are saturated so that inductances 12′ provide a low AC impedance. Consequently, the output leads 36 provide a relatively low output signal.

When a key is depressed so that its core 12 is unsaturated, the corresponding inductor 12′ presents a high AC impedance. The joint 38 in the corresponding series circuit rises to a higher level and this signal appears on the output lead 36. When the key is released, the core desaturates and the signal on lead 36 returns to its normal level.

Figure 10:
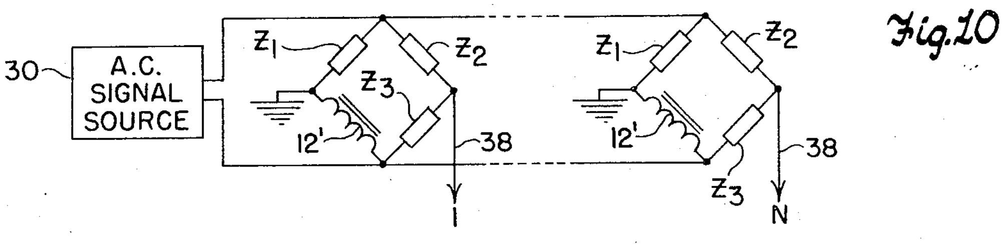
FIG. 10 is a circuit diagram illustrating how the switch may be employed as a variable inductor in a bridge arrangement.

FIG. 10 shows how the key switches of the present invention may be incorporated as variable inductors in a bridge arrangement. There is a bridge circuit for each key switch and each bridge has three impedances $Z_1$, $Z_2$, and $Z_3$. The fourth leg of each bridge includes a variable inductor 12′. One side of the AC signal source 30 is connected to each bridge between $Z_1$ and $Z_2$ and the other side is connected between $Z_3$ and inductor 12′. Each bridge is grounded between $Z_1$ and inductor 12′ and an output lead 38 is connected between $Z_2$ and $Z_3$.

The circuit of FIG. 10 operates as follows. When no key is depressed, all cores 12 are saturated so that all impedances 12′ are relatively low. However, the impedances of the bridge circuit are chosen such that the bridges are balanced when the impedances 12′ are at a high value. Therefore, a high level output signal appears on all of the leads 38.

Assume that the key corresponding to the numeral "1" is depressed. The core 12 desaturates and thus presents a high AC impedance 12′. This balances the bridge circuit for the "1" switch so that the output lead 38 for the "1" switch drops to a low level. Upon release of the "1" key, the bridge again becomes unbalanced and the output lead returns to the high level.

Figure 11:
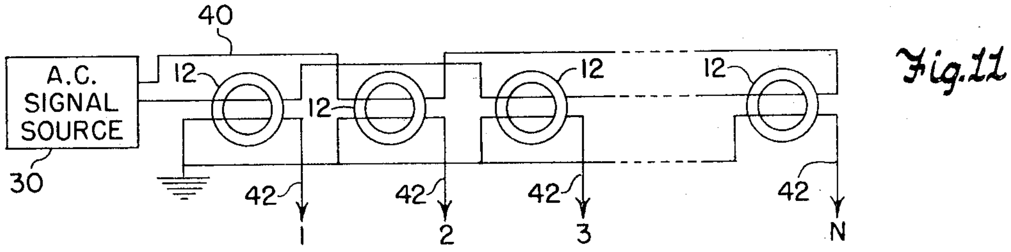
FIG. 11 is a circuit diagram illustrating a noncoded keyboard wherein the switch is employed as a transformer.

FIG. 11 shows a further keyboard circuit arrangement comprising a plurality of switches. In this embodiment, the cores 12 act as transformers. An AC drive winding 40 threads each of a plurality of cores 12, and is connected to an AC signal source 30. Each core is threaded by a sense winding 42 which is connected to ground at one end.

As long as no keys are depressed, the cores 12 are all saturated and cannot function as transformers. Upon depression of any key, the core corresponding to that key desaturates. The AC signal on the drive winding 40 is coupled to the sense winding 42 so that an AC output signal is produced on the sense winding. When the key is released, the core is again saturated so that the AC drive signal is not coupled to the sensing winding.

Figure 12:
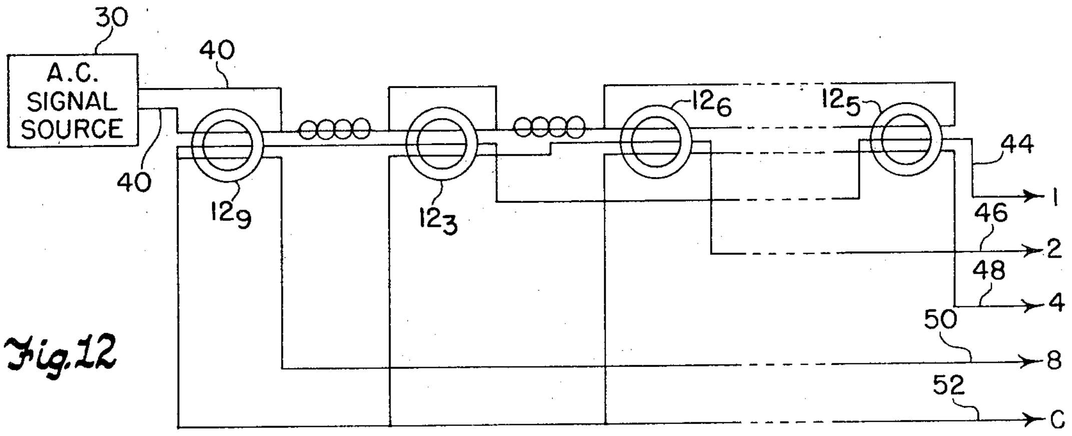
FIG. 12 is a circuit diagram illustrating a coded keyboard wherein the switch is employed as a transformer.

The circuit of FIG. 11 illustrates a nonencoded keyboard circuit. That is, when a key is depressed an AC signal appears on only one sense winding 42, that sense winding corresponding to the depressed key. FIG. 12 illustrates how the present invention may be incorporated in a keyboard giving binary coded decimal output signals representing the key depressed.

The embodiment of FIG. 11 comprises a plurality of cores 12, there being one core for each key on the keyboard. Each core reference numeral includes a subscript corresponding to the numeric value assigned to that key. A drive winding 40 threads each of the cores and is connected to an AC signal source 30. One or more sense windings 44, 46 and 48 and 50 are selectively threaded through the cores. The number of sense windings varies depending upon the type of code employed. For purposes of illustration only, it is assumed that the partial circuit of FIG. 12 produces a numeric binary coded decimal output, hence four sense windings are required. The sense windings are connected at one end to a common lead 52.

As long as no keys are depressed, all cores 12 are saturated so that the AC signal on drive winding 40 is not coupled to any sense windings. When a key, such as the numeral "3" key, is depressed, the flux gate associated with the "3" key is moved downwardly to divert flux away from core $12_3$ and the core desaturates. The core $12_3$ then functions as a transformer so that the AC signal on drive winding 40 induces AC signals on sense windings 44 and 46. Signals occurring simultaneously on windings 44 and 46 represent the numerical three in binary coded decimal notation. When the "3" key is released, the core $12_3$ is again saturated by the permanent magnet and the signals on windings 44 and 46 terminate.

As a further example, assume that the "9" key is depressed. In this case the flux gate is moved into flux diverting position adjacent core $12_9$. The core $12_9$ desaturates and acts as a transformer so that the AC signal on drive winding 40 induces AC signals on sense windings 44 and 50. Signals occurring concurrently on windings 44 and 50 represent the numeral "9" in binary coded decimal notation.

It will be understood that the number of sense windings will depend upon the particular code output which it is desired to obtain from the keyboard. Generally speaking, there should be a sense winding for each place or order in the desired code. The number of sense windings threading a particular core is dependent upon the value represented by the key corresponding to that core, and upon the particular code employed. For example, in either a straight binary or a straight binary coded decimal keyboard, the core for the "2" key would be threaded by only one sense winding since the value "2" in either of these codes in represented by 0010. On the other hand, for the excess "3" binary coded decimal code the "2" key would be threaded by two sense windings since the value "2" in this code is represented by 0101.

As shown in FIG. 12, the outward and return legs of the drive winding are twisted together between cores so that the electromagnetic fields generated by the AC signal on the drive winding cancel in space. This reduces the cross-coupling between the drive and sense winding in the regions between cores where, because of the close spacing between windings, there might otherwise be a residual pickup of the AC signal in the sense windings.

FIG. 11 illustrates another drive winding arrangement which may advantageously be used in the circuit of FIG. 12 for achieving signal cancellation. In this arrangement, one drive winding threads alternate cores in one direction and threads the remaining cores in the opposite direction. The fields produced by the two legs of the drive winding cancel in space thus reducing cross-coupling between the drive and sense windings.

The signal cancellation arrangement of FIG. 11 has a distinct advantage when used in a coded keyboard such as that of FIG. 12 in that sense windings may thread through all the cores in the same direction. This simplifies the wiring procedure and reduces manufacturing costs.

In summary, the present invention provides a novel keyboard switch which, because of its unique construction, is simple and reliable. The construction of the switch simplifies the wiring procedure necessary to incorporate a plurality of the switches into a keyboard with either a coded or a non-coded output. The switch may be used as either a transformer or a variable inductor. It may be used in a keyboard producing an output in any one of various codes and the coding may be changed merely by changing the sense windings. Furthermore, the present invention eliminates the critical spacing requirements inherent in the prior art devices using a flux shield.

While preferred embodiments of the invention have been shown and described, it will be understood that various substitutions and modifications may be made without departing from the spirit and scope of the invention as defined by the appended claims. For example, toroidal cores have been shown but cores of other shapes, preferably closed path, may be used. Furthermore, the core need not be disposed in a vertical plane but may be inclined or disposed in a horizontal plane even through this would render the keyboard wiring procedure more difficult.

I claim:

1. A keyboard switch comprising:
a magnetic core,
a permanent magnet positioned with one magnetic pole disposed adjacent said core for applying a saturating flux to said core, and with the other magnetic pole positioned sufficiently removed from said core to effectively prevent flux saturation of said core by said other magnetic pole,
a manually operable flux gate formed of a material having low reluctance and having a width greater than the distance between said magnet and said core,
said flux gate being operable between a first position whereat it does not affect said flux and a second position whereat said flux is diverted away from said core and through said flux gate,
and winding means threading said core.

2. A keyboard switch as claimed in claim 1 wherein one surface of said flux gate mates with a surface of said permanent magnet.

3. A keyboard switch as claimed in claim 1 wherein said permanent magnet is rectangular in cross section and said flux gate has a U-shaped portion which mates with three sides of said permanent magnet when said flux gate is moved to said second position.

4. A keyboard switch as claimed in claim 1 wherein:
said magnetic core is disposed in a first plane, and,
said flux gate is disposed for movement in a second plane transverse to said first plane,
said flux gate having a recess in one portion thereof which is wider than the thickness of said core whereby said flux gate straddles said core when moved to said second position.

5. A keyboard comprising:
a permanent magnet having a north pole and a south pole,
a magnetic core disposed adjacent each of said poles whereby said cores are normally saturated by said flux from the adjacent pole and substantially unsaturated by any flux from the other pole of said permanent magnet,
a key operated flux gate formed of a material having low reluctance for each of said cores, each said flux gate being operable between a first position whereat it does not affect said flux and a second position whereat said flux is diverted away from one of said cores and through the flux gate,
and winding means threading said cores.

6. A keyboard as claimed in claim 5 wherein each said flux gate is disposed in a plane transverse to the plane of its associated core and each flux gate has a recess whereby it may straddle said associated core when moved to said second position.

7. A keyboard as claimed in claim 5 wherein a plurality of cores are disposed adjacent a pole of said magnet, and wherein said winding means comprises drive winding means, said keyboard including source means for applying drive signals to said drive winding means.

8. A keyboard as claimed in claim 7 wherein the impedance of a core changes when its corresponding flux gate is moved from said first to said second position, said keyboard further comprising:
output means connected to said drive winding means intermediate said source means and said core.

9. A keyboard as claimed in claim 7 wherein the impedance of a core changes when its corresponding flux gate is moved, said keyboard further comprising:
a bridge circuit for each of said keys, the impedance of one of said cores comprising the impedance in one leg of each of said bridges;
all of said bridges being unbalanced when all of said flux gates are in one of said positions and one of said bridges being balanced when its corresponding flux gate is in the other of said states; and,
means connected to each of said bridges for producing an output signal representing the position of the corresponding flux gate.

10. A keyboard as claimed in claim 7 and further comprising sense winding threading each of said cores.

11. A keyboard as claimed in claim 7 and further comprising sense-winding means threading said cores,
said sense-winding means comprising a sense winding for each order of a code in which output signals from said keyboard are to be coded,
and each core being threaded by one or more sense windings, a particular core being threaded by a sense winding only if an output signal is required in the order corresponding to said sense winding to represent in said code the character corresponding to said core switch.

12. A keyboard as claimed in claim 11 wherein said drive-winding means comprises a current conductor threading alternate cores in one sense and the remaining cores in the opposite sense to thereby reduce residual pickup of said drive signal in said sense windings.

13. A keyboard as claimed in claim 11 wherein said drive-winding means comprises a current conductor having one leg threading each of said cores and a second leg returning to said source, said legs being twisted about each other in the regions intermediate said cores to thereby cancel in said regions the electromagnetic fields resulting from current flow through said legs.

* * * * *